United States Patent
Matsumoto et al.

(10) Patent No.: US 8,357,241 B2
(45) Date of Patent: Jan. 22, 2013

(54) METHOD OF ORGANIC MATERIAL VACUUM EVAPORATION AND APPARATUS THEREOF

(75) Inventors: Eiichi Matsumoto, Mitsuke (JP); Yoshiko Abe, Mitsuke (JP); Yuji Yanagi, Hiroshima (JP)

(73) Assignee: Canon Tokki Corporation, Niigata (JP)

( * ) Notice: Subject to any disclaimer, the term of this patent is extended or adjusted under 35 U.S.C. 154(b) by 1059 days.

(21) Appl. No.: 11/990,829

(22) PCT Filed: Aug. 18, 2006

(86) PCT No.: PCT/JP2006/316232
§ 371 (c)(1),
(2), (4) Date: Dec. 30, 2008

(87) PCT Pub. No.: WO2007/023737
PCT Pub. Date: Mar. 1, 2007

(65) Prior Publication Data
US 2009/0176036 A1 Jul. 9, 2009

(30) Foreign Application Priority Data
Aug. 25, 2005 (JP) .................................. 2005-244238

(51) Int. Cl.
*C30B 23/00* (2006.01)
*C23C 16/00* (2006.01)

(52) U.S. Cl. ............ 117/84; 117/88; 117/104; 117/107; 118/715; 118/723 VE; 118/724; 118/726

(58) Field of Classification Search .................... 117/84, 117/88, 104, 107; 118/715, 723 VE, 724, 118/726
See application file for complete search history.

(56) References Cited

U.S. PATENT DOCUMENTS

| | | | |
|---|---|---|---|
| 2004/0016400 A1 | 1/2004 | Kim et al. | |
| 2004/0035366 A1* | 2/2004 | Keum et al. | ..................... 118/726 |
| 2004/0223751 A1* | 11/2004 | Kato et al. | ..................... 392/389 |
| 2005/0016461 A1 | 1/2005 | Klug et al. | |
| 2008/0081015 A1* | 4/2008 | Sarayama et al. | ............ 423/409 |

FOREIGN PATENT DOCUMENTS

| | | |
|---|---|---|
| EP | 1 382 713 | 1/2004 |
| JP | 58-019471 | 2/1983 |
| JP | 58019471 A * | 2/1983 |

(Continued)

OTHER PUBLICATIONS

Extended European Search Report corresponding to European Patent Application No. 06796543.4-2122 dated May 3, 2010.

(Continued)

*Primary Examiner* — Matthew Song
(74) *Attorney, Agent, or Firm* — Jenkins, Wilson, Taylor & Hunt, P.A.

(57) ABSTRACT

There is provided a method of vacuum evaporation comprising causing evaporated material (5) from vacuum evaporation source (20) furnished with container (1) with its one side open accommodating organic material (2) to form a film on opposed substrate (7), wherein the vacuum evaporation source has heating element (3) not fixed to the container, and being in contact with the surface of organic material held in the container, and wherein the organic material is evaporated by heating of the heating element only, the evaporated material released through at least one hole (6) or at least one slit made in the heating element.

18 Claims, 2 Drawing Sheets

FOREIGN PATENT DOCUMENTS

| | | |
|---|---|---|
| JP | 02-145763 | 6/1990 |
| JP | H6-223970 | 8/1994 |
| JP | 11-222668 | 8/1999 |
| JP | 2001-323367 | 11/2001 |
| JP | 2004353084 A * | 12/2004 |
| JP | 2006-002218 | 1/2006 |
| JP | 2006-059640 | 3/2006 |
| RU | 2000357 C * | 9/1993 |
| WO | WO02/14575 | 2/2002 |
| WO | WO2007/023737 | 3/2007 |

OTHER PUBLICATIONS

International Search Report in PCT/JP2006/316232 dated Nov. 14, 2006.

International Preliminary Report on Patentability (Chapter I of the Patent Cooperation Treaty) corresponding to International Patent Application No. PCT/JP2006/316232 dated Feb. 26, 2008.

* cited by examiner

METHOD OF ORGANIC MATERIAL VACUUM EVAPORATION AND APPARATUS THEREOF

RELATED APPLICATIONS

The application is the U.S. National Stage of PCT International Application No. PCT/JP2006/316232, filed on Aug. 18, 2006, which claims priority to Japanese Patent Application No. 2005-244238, filed on Aug. 25, 2005.

FIELD OF THE INVENTION

The present invention relates to a method of organic material vacuum evaporation and an apparatus thereof.

BACKGROUND OF THE INVENTION

For example, vacuum evaporation is used as a fabricating method of organic layers, such as an organic electro-luminescence (EL) device. Usually, in a vacuum evaporation method, a substrate is placed opposite to a film formation material under a vacuum environment, and the evaporated material obtained by heating a film formation material to vapor pressure temperature is made to adhere to the substrate surface. Here, a resistance heating method, a heater heating method, an induction heating method, an electron beam (hereinafter, referred to "EB") method, etc. are cited as the heating method of the film formation material.

Among these, the resistance heating method performs energizing a container which contains the film formation material as a resistor, the heater heating method heats a container with the heater placed on the outer circumference of the container, and the induction heating method heats a container or a film formation material by an electromagnetic induction action from the induction coil installed outside. On the other hand, the EB method irradiates a film formation material with an electron beam from the exterior, and heats the film formation material.

By the way, since many organic materials have a low melting point and high vapor pressure, they evaporate at low temperature. Therefore, when using an organic material as the source of film formation of vacuum evaporation, heating temperature is set up low. For example, when forming the organic layer for an organic EL device, evaporating temperature is about 200 to 400 degrees C. Therefore, when evaporating an organic material, the vacuum evaporation rate in a low heating temperature range needs to be controlled.

However, in the case of a resistance heating method, since a container becomes a heating resistor, it is difficult to enlarge size of the container from the relation of electric capacity. In this method, although the heating rate is high, there is a problem that the loading weight of a film formation material is restricted and it is not suitable for the large-scale evaporation apparatus for mass production.

On the other hand, in the case of the heater heating method, since indirect heating of a container is performed, heating time is long and heating response is also not good and then it is difficult to control the vacuum evaporation rate. In particular, since the organic material has low thermal conductivity, the heating time may reach to several hours in a mass production apparatus. Furthermore, in this method, since a material inside the container is heated over the whole, the organic material remaining in the container to the last is exposed to the evaporating temperature for long duration, and there is a possibility of causing degradation, such as thermal decomposition.

In the case of EB method irradiation of a film formation material with an electron beam, the intermolecular bonding force of the organic material is weak (about several eV). Therefore, since intermolecular bonds are cut and molecules becomes high temperature if the organic material is directly irradiated with the electron beam of high energy, the problem of the organic material decomposition and deterioration occurs.

Accordingly, a technology which indirectly irradiates a container which contains organic material with an electron beam is proposed (for example, refer to Patent Document 1).

Furthermore, a technology which mixes the fine particles of an organic compound and a material with large thermal conductivity, such as ceramics, in a container is proposed as the way of improving thermal conductivity using the above-mentioned heater heating method (for example, refer to Patent Document 2). If composed in this way, ceramics etc. spread heat to the inside of the container, and the heating becomes uniform.

On the other hand, a technology which evaporates an organic material with an induction heating method is proposed (for example, refer to Patent Document 3). This technology discloses a method of charging the organic material into the container heated by electromagnetic induction, and performing electromagnetic induction heating of the container, or a method of charging the filler heated by electromagnetic induction with the organic material into the container, and performing electromagnetic induction heating of the filler. Since this method performs direct heating of the container, heating time is short compared with the above-mentioned indirect heating method, and the response of a vacuum evaporation rate is also excellent and control of the vacuum evaporation rate is easy.

Patent Document 1: Japanese Patent Application Laid-open No. H6-223970 (paragraph 0037)
Patent Document 2: Japanese Patent Application Laid-open No. 2001-323367 (paragraph 0014)
Patent Document 3: Domestic Re-publication of PCT International Publication for Patent Application No. 02/014575 (FIGS. 1 to 3)

DISCLOSURE OF THE INVENTION

Problem to be Solved by the Invention

However, since indirect heating is used in the case of the above-mentioned technology described in Patent Document 1, there is a problem that the uniform heating and the rate control are difficult, like the above-mentioned heater heating method or the induction heating method.

On the other hand, since the filler exists in the case of the technology described in Patent Document 2, the loading weight of the organic material in the container decreases extremely, and also soaking heat property is influenced by the contact state of the filler and the organic material. Therefore, it is insufficient in respect of shortening of heating time or the control property of the vacuum evaporation rate.

In the case of the technology described in Patent Document 3, in the method of heating a container like the heater heating method, since the material inside the container is heated over the whole, there is a possibility that the organic material remaining in the container to the last may pyrolyze. In the method of heating the filler in the same technology, since matching of the frequency of induction heating is changed according to the mixing amount of the filler or the mixing distribution, the repeatability of heating is not acquired and it is not practical.

The present invention is achieved in order to solve the above-mentioned subject, and an aim of the present invention is to provide a method of organic material vacuum evaporation that realizes avoiding of any thermal deterioration of organic material contained in a vacuum evaporation source, attaining of productivity and stable controlling of vacuum evaporation rate over a prolonged period of time, and to provide an apparatus thereof.

Means to solve the Problems

In order to achieve the above-mentioned purpose, a method of organic material vacuum evaporation according to the present invention provides a method for forming an evaporated material on a substrate opposed from a vacuum evaporation source, wherein the vacuum evaporation source is provided with a container containing an organic material and having one open side, the vacuum evaporation source having a heating element which is not fixed to the container and which is in contact with the surface of the organic material held in the container, the method comprising the steps of: evaporating the organic material by heating only the heating element; and releasing the evaporated material through at least one hole or at least one slit formed in the heating element.

If composed like this, since only the organic material near the heating element, instead of the whole organic material in the container, is brought to the evaporating temperature, prevention of the thermal deterioration of the organic material, shortening of the rise time of the vacuum evaporation rate, and an improvement of the response of the vacuum evaporation rate are achieved. In particular, the present invention is effective in vacuum evaporation performed under large-scale mass production.

As the method for heating the heating element, it is preferred to use at least one or more kinds of electron beam heating, high frequency induction heating, laser beam heating, and infrared heating.

It is preferred that a plurality of the containers are provided, or the inside of the container is divided into a plurality of partitions, wherein the process of the vacuum evaporation by heating one of the plurality of containers or partitions, and when the organic materials in the container or the partition decrease, changing to another container or partition and heating is repeated, and the vacuum evaporation is performed by using each container or partition one after another continuously.

If composed like this, since the vacuum evaporation can be continued using another container even if the organic materials in one container decrease, productivity improves.

Furthermore, it is preferred to fill up the organic material in the container or the partition in which the organic materials decreased, through the hole of the heating element or the slit provided in the plurality of containers or partitions respectively, or other holes formed in the heating element.

If composed like this, since it is possible to supply the container with organic materials within the vacuum apparatus in which the organic materials decreased, and it is not necessary to fill up the organic material by canceling the vacuum, so productivity further improves.

It is preferred that the container is held below or at the evaporating temperature of the organic material.

If composed like this, the thermal deterioration of the organic material in the container is further prevented.

The organic material vacuum deposition apparatus according to the present invention is to emit an evaporated material for forming a film on an opposed substrate, the apparatus comprising: a container for containing an organic material used as the evaporated material, with its one side open; a heating element, being smaller than the opening, and, without being fixed to the container, being in contact with the surface of the organic material in the container, the heating element having at least one hole for releasing the evaporated material, or having at least one slit for releasing the evaporated material from the container; and a heating source for heating only the heating element.

It is preferred that the heating source is at least one or more kinds of an electron beam heating source, a high frequency induction heating source, a laser beam heating source, and an infrared heating source.

It is preferred that a plurality of the containers are provided, or that the inside of the container is divided into a plurality of partitions, and the heating element is provided for the plurality of containers or partitions respectively, wherein the apparatus further comprises a moving means for moving the plurality of containers or partitions to a predetermined heating position in order to heat the heating element which one of the plurality of containers or partitions possesses by using the heating source, while the moving means disengages from the heating position the container or partition from which the evaporated material had been emitted and from which the organic materials have therein decreased.

It is preferred to further comprise an organic material feed feature for supplying the organic material to the container or partition the organic materials therein decreased, through the hole or the slit of the heating element provided in the plurality of containers or partitions respectively, or other holes formed in the heating element.

Effect of the Invention

According to the present invention, the thermal deterioration of the organic material contained in the vacuum evaporation source can be avoided, and the vacuum evaporation can be stably performed over a prolonged period of time. Furthermore, according to the present invention, productivity improves, and the vacuum evaporation rate can be controlled stably over a prolonged period of time.

DESCRIPTION OF THE PREFERRED EMBODIMENT(S)

Hereinafter, embodiments of the present invention will be described.

First Embodiment

Figure 1:
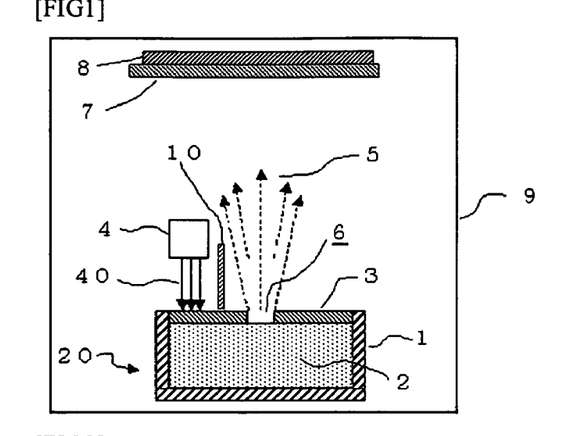
FIG. 1 is a cross section schematic diagram showing an example of a vacuum evaporation apparatus according to a first embodiment of the present invention.

FIG. 1 is a cross section schematic diagram showing an example of the vacuum evaporation apparatus according to a first embodiment of the present invention. The first embodiment is an example in the case of using EB or a laser beam (hereinafter, referred to "LB") as an energy source to evaporate an organic material.

In FIG. 1, a vacuum evaporation apparatus 20 and a substrate holder 8 are placed opposite one another in a chamber 9, a substrate 7 is attached to a substrate holder 8, and evaporation particles (vaporized organic material) 5 which evaporated from the vacuum evaporation apparatus 20 form a film on the substrate 7. The vacuum evaporation apparatus 20 includes a container 1, a heating element 3, a heating source 4 (EB or LB), and a partition plate for shielding 10. An organic material (film formation material) 2 is contained in the container 1.

In addition, a shutter and a vacuum evaporation rate measuring system (for example, a crystal oscillating type thickness control device) which are not illustrated may be provided in the space between the substrate 7 and the container 1 if needed.

The container 1 is a cylindrical shape. The heating element 3 is a doughnut shape slightly smaller than the inside diameter of the container 1, and covers the top opening of the container 1, and the undersurface of the heating element 3 is in contact with the upper surface of the organic material 2 contained in the container 1.

The heating source 4 is placed on the upper side of the outer edge section of the upper surface of the heating element 3, and irradiates the concerned outer edge section with EB or LB to heat. And then, when the heating element 3 is heated, heat conducts to the upper surface of the organic material 2 from the undersurface of the heating element 3, and the generated evaporation particles 5 pass through a hole 6 provided in the center of the heating element 3, and then reach to the substrate 7.

Figure 2:
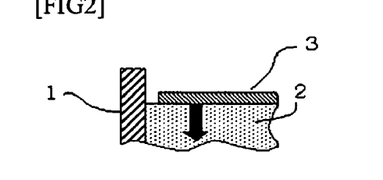
FIG. 2 is a partial enlarged view of FIG. 1.

FIG. 2 shows a partial enlarged view near the point of contact of the container 1 and the heating element 3. In this view, the periphery of heating element 3 is not fixed to the inwall of the container 1, suitably contacts or is estranged from the inwall, and the undersurface of the heating element 3 is always in contact with the surface of the organic material 2. If composed in this way, it is hard to transfer the heat of the heating element 3 to the container 1, and the temperature rise of the whole container is suppressed.

Since the organic material 2 is a solid (usually powder), by only placing the heating element 3 on the surface of the organic material 2, the altitude of heating element 3 changes following the altitude change of the organic material 2 in the container 1 by progress of evaporation, and the bottom of the heating element 3 always contacts the surface of the organic material 2. And then, when EB is irradiated to the external surface of the heating element 3, the temperature of the organic material 2 of the part in contact with the undersurface of the heating element 3 rises, and then reaches the evaporating temperature. The organic material 2 evaporates, passes through hole 6, becomes the evaporation particles 5, and a layer is formed on the surface of the substrate 7. During this heating, as for the organic material 2 in the container 1, since only the part which contacts the heating element 3 is heated and the whole organic material 2 is not heated, there is almost no thermal deterioration of an organic material in vacuum evaporation over a prolonged period of time.

In addition, when the heating element 3 is irradiated with EB etc., secondary electrons, backscattered electrons, or X-rays are emitted from the heating element 3, and these may have a bad influence on a TFT substrate etc. in a process of formation of an organic EL device. Then, the secondary electrons etc. emitted from the upper surface of the outer edge section of the heating element 3 can be prevented from reaching the substrate 7 by placing partition plate 10 for shielding inside the irradiated area (upper surface of outer edge section) of the heating element 3.

Moreover, it is preferred to place the cooling feature of a water-cooled jacket etc. on the outside of the container 1, and to cool the container 1 except the part which is in contact with the heating element 3. In this case, the thermal deterioration of the organic material can be more efficiently prevented by cooling the container 1 to the temperature below the melting point of the organic material.

The heating source 4 may be used individually, and a plurality of heating sources may be also simultaneously used in order to improve evaporation efficiency.

Since the evaporating temperature range of the organic material used for organic electro-luminescence etc. is almost 200 to 400 degrees C., as a construction material of the heating element 3, it is preferred that the thermal conductivity is satisfactory in this temperature range, and the construction material does not react with the organic material mutually. As the construction material of the heating element 3, a metal material, a carbon material, or a ceramic material is specifically preferred.

More specifically, tungsten, molybdenum, titanium, aluminum, etc. can be used as the metal material. Furthermore, although the carbon material may be a simple carbon substance, it is more preferred to use a material with a special coating treated on the surface of carbon. By treating the surface of the carbon with a special coating, the physical/chemical stability on the surface of the carbon improves, and contamination of the organic material can be prevented. As the ceramic material, it is usable if it is general-purpose ceramics, such as silicon carbide, silicon nitride, alumina, zirconia, or composite ceramics like sialon.

The position and the number of the hole 6 of the heating element 3 is not limited above. It is preferable just to adjust the position and the number of the hole 6 so that the region evaporated on the substrate may be at a suitable position.

Figure 3:
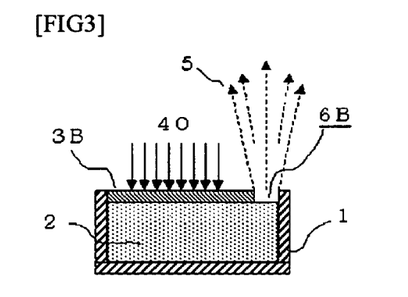
FIG. 3 is a cross section schematic diagram showing another example of a heating element of the vacuum evaporation apparatus installed in a container according to the first embodiment of the present invention.

Furthermore, as shown in FIG. 3, a hole is not provided in the heating element 3B, but the size of heating element 3B may be made quite smaller than the inside diameter of the container 1 (for example, it is about 5 mm about the difference of both diameter), a slit 6B (the maximum width is set to about 5 mm) may be made to form between the periphery of the heating element 3B and the inwall of the container 1, and an evaporated material may be released from the slit 6B. In this case, since a hole is not provided in the heating element 3B, any part on the upper surface of the heating element can be irradiated with EB etc. Accordingly, since the area irradiated with EB etc. can be changed easily, regulation of the irradiance level of required EB becomes easy.

Second Embodiment

Figure 4:
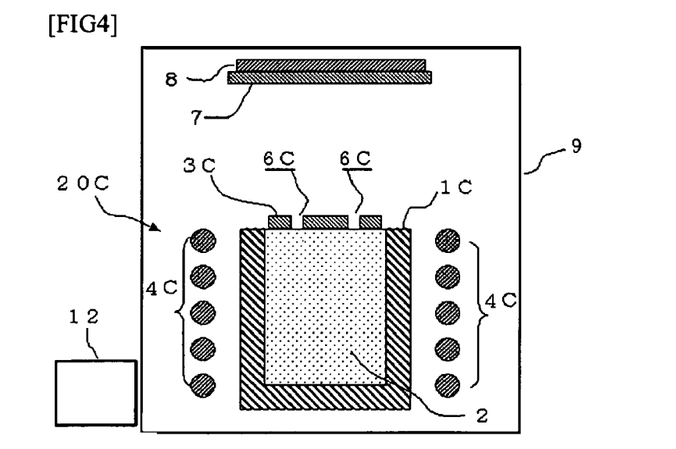
FIG. 4 is a cross section schematic diagram showing an example of a vacuum evaporation apparatus according to a second embodiment of the present invention.

FIG. 4 is a cross section schematic diagram showing an example of the vacuum evaporation apparatus according to a second embodiment of the present invention. The second embodiment is an example in the case of using the source of high frequency induction heating as the energy source for evaporating the organic material.

In FIG. 4, about the same component as the first embodiment (FIG. 1), the same reference numeral is attached and its explanation will be omitted. In FIG. 4, a vacuum evaporation apparatus 20C includes a container 1C, a heating element 3C, a heating source (induction coil for high frequency induction heating) 4C, and a high-frequency power source 12.

In the second embodiment, the material of the container 1C needs to emit no heat by high frequency induction unlike the case of the first embodiment. Specifically, it is preferred that it is a ceramic material. More specifically, the ceramic material the same as that being used for the heating element 3 of the first embodiment can be used.

By composing as mentioned above, only the heating element 3C is heated with the induction coil 4C, and heat conducts on the upper surface of the organic material 2 which contacts the undersurface of the heating element 3C. Two holes 6C are provided in the heating element 3C at the predetermined distance, and the evaporated material is emitted through the holes 6C.

In addition, in the second embodiment, since it is not necessary to provide the region for irradiating the heating element 3C with EB etc., the flexibility of the position and the number of holes or slits provided in the heating element 3C increase.

Furthermore, it is preferred to cool the container except the part which is in contact with the heating element, the heating source may be used individually, and a plurality of heating sources may be used simultaneously. These are the same as the case of the first embodiment.

Third Embodiment

Figure 5:
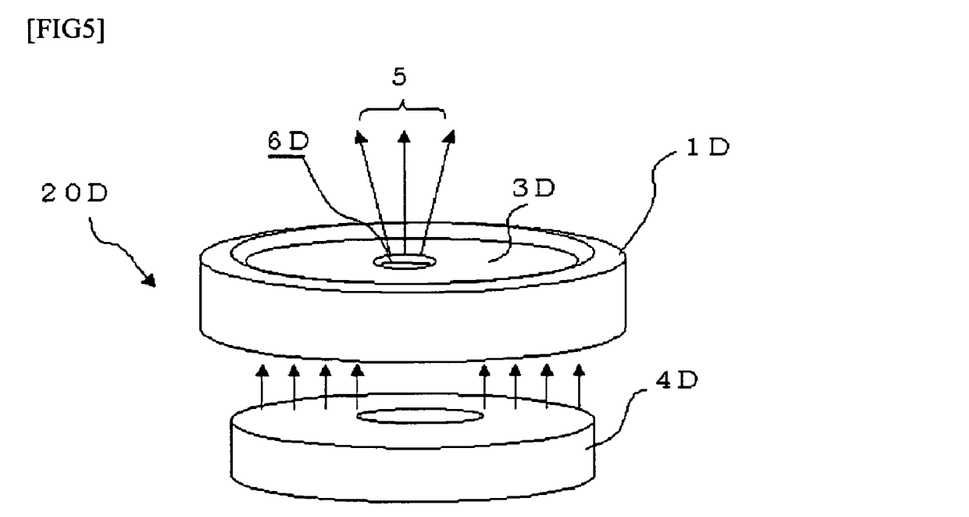
FIG. 5 is a cross section schematic diagram showing an example of a vacuum evaporation apparatus according to a third embodiment of the present invention.

FIG. 5 is a cross section schematic diagram showing an example of a vacuum evaporation apparatus according to the third embodiment of the present invention. The third embodiment is an example in the case of using an infrared heating source as the energy source for evaporating the organic material.

In FIG. 5, about the same component as the first embodiment (FIG. 1), the same reference numeral is attached and its explanation will be omitted. In FIG. 5, a vacuum evaporation apparatus 20D includes a container 1D, a heating element 3D, and a heating source (infrared heating source) 4D.

In the third embodiment, the material of the container 1 needs not to absorb infrared rays. Specifically, quartz glass etc. can be used. In addition, although the materials used for the heating element 3D differ according to the organic material 2, they need for the rate of infrared absorption of the heating element 3D to be larger than the rate of infrared absorption of the organic material 2 as a principle. Although the infrared heating source 4D may be placed on the upper part or placed to the side of container 1D, when the dirt of infrared heating source 4D by adhesion of evaporation particles, high-temperature degradation of the organic material by the heat from the heating source, and maintenance property are taken into consideration, placing under the container 1D is preferred.

By composing as mentioned above, only heating element 3D is heated by the infrared heating source 4D, and heat conducts on the upper surface of the organic material 2 which contacts the undersurface of the heating element 3D. The evaporated material is emitted through a central hole 6D of the heating element 3D.

Furthermore, it is preferred to cool the container except the part which is in contact with the heating element, the heating source may be used individually, and a plurality of heating sources may be used simultaneously. These are the same as the case of the first embodiment.

Fourth Embodiment

Figure 6:
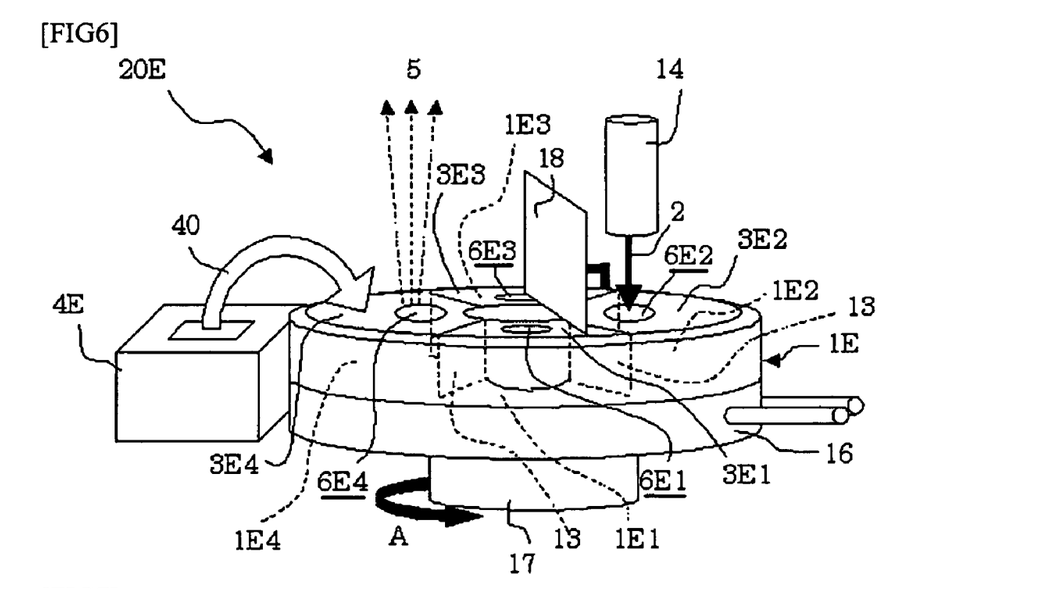
FIG. 6 is a cross section schematic diagram showing an example of a vacuum evaporation apparatus according to a fourth embodiment of the present invention.

FIG. 6 is a cross section schematic diagram showing an example of a vacuum evaporation apparatus according to a fourth embodiment of the present invention. The fourth embodiment is an example in the case of using EB or LB as the energy source for evaporating the organic material.

In FIG. 6, about the same component as the first embodiment (FIG. 1), the same reference numeral is attached and its explanation will be omitted. In FIG. 6, a vacuum evaporation apparatus 20E includes a container 1E, heating elements 3E1 to 3E4, a heating source (EB) 4E, an organic material feed feature 14, a cooling feature 16, a rotating feature 17, and a partition plate 18.

The container 1E has a cylindrical shape with a central axis, and is placed on the cooling feature (water-cooled jacket) 16. The central axis of the container 1E is connected to the rotating feature 17 of the lower part of the cooling feature 16, and the container 1E rotates to the circumference of the central axis along with the rotating feature 17 rotating in the direction of arrow A of the drawing.

Moreover, the container 1E is divided into four cells 1E1 to 1E4 with four separation boards 13 prolonged toward the container 1E outer circumference from the central axis. Each cell 1E1 to 1E4 has the shape of a cylinder like object with base which achieves the fan shape whose cut end is abbreviated one quarter of a circle, and the organic material 2 is contained in each cell, respectively. The heating elements 3E1 to 3E4 are slightly smaller than the cut end of the fan shape of each cell 1E1 to 1E4, and float on the upper surface of the organic material 2 without being in contact with the inwall of each cell. These are the same as the case of FIG. 2 mentioned above.

Furthermore, one of the holes 6E1 to 6E4 is provided in the center of each heating element 3E1 to 3E4, respectively.

A heating source (EB) 4E is placed in the side of the container 1E. An electron beam 40 which jumps out from the heating source 4E toward the upper part is deflected by 180 degrees or 270 degrees in a magnetic field circuit which is not illustrated, and irradiates the heating element 3E4. And when the heating element 3E4 is heated by irradiation of the electron beam 40, the organic material 2 evaporates, and the evaporation particles 5 jump out from the hole 6E4 of heating element 3E4.

An organic material feed feature 14 is placed on upper part of the cell 1E2 which faces the cell 1E4 in view of the container 1E, and charge of an organic material 2 can be achieved at the hole 6E2 of the heating element 3E2 of the cell 1E2 which is directly under the organic material feed feature 14.

In addition, the partition plate 18 is placed just above the central axis of the container 1E, and prevents that the evaporation particles 5 which jump out from the heating element 3E4 irradiated with EB adhere to the organic material feed feature 14. Moreover, the partition plate 18 is grounded electrically, and absorbs the backscattered electrons generated from the electron beam 40. Furthermore, since high energy particles enter into the partition plate 18 from the electron beam 40, and since the partition plate 18 is near the evaporation source, it is water-cooled.

And in this embodiment, if the organic material contained in the cell 1E4 is exhausted, the whole container 1E rotates one quarter revolution according to the rotating feature 17, and the irradiation position (heating position) of the electron beam becomes the position of the heating element 3E3 of adjacent cell 1E3. On the other hand, if the container 1E rotates one quarter revolution, the cell 1E1 moves directly under the organic material feed feature 14 (the cell 1E1 already has exhausted an organic material).

Therefore, since the cell wherein the organic material therein exhausted is supplied with an organic material, and the cell finished being supplied with the organic material can be used as an evaporation source, simultaneously, it becomes possible to carry out vacuum evaporation and supplementation of the organic material continuously without suspending the apparatus and canceling the vacuum. Thus, it can evaporate continuously.

In addition, in the above-mentioned explanation, although the hole to which evaporation particles are emitted from each heating element and the hole to supply the organic material are common, these holes may be provided separately. Moreover, a shutter may be provided over these holes if needed, and material can be supplied in the cell by another method without using the hole for organic material supply.

Furthermore, in the above-mentioned explanation, although a plurality of cells are located annularly to the circumference of the central axis, it is not limited to this location. For example, a plurality of cells are arranged in straight line, and a heating source is provided in the position at which the heating element of the cell is heated. And then, if an organic material is exhausted, this cell may be moved directly under the adjacent organic material feed feature, and an organic material may be made to fill up. In this case, the cell in which the organic material is contained moves to the heating position. And if a final cell moves to the heating position and the organic material is exhausted, a cell group returns to the counter direction on a straight line, and then the top cell supplied with the organic material is placed on the heating position.

Moreover, a plurality of cells may not be moved, the heating source and the organic material feed feature may be moved instead, and then vacuum evaporation from the container and its supply of the organic material may be performed.

Furthermore, in order to suppress contamination of the filament which generates the electron beam in the heating source 4E, it is preferred that the above-mentioned deflection of the electron beam shall be 270 degrees.

EXAMPLES

Hereinafter, although the present invention will be explained citing examples, the present invention is not limited to these examples.

Example 1

Example According to the First Embodiment

Figure 7:
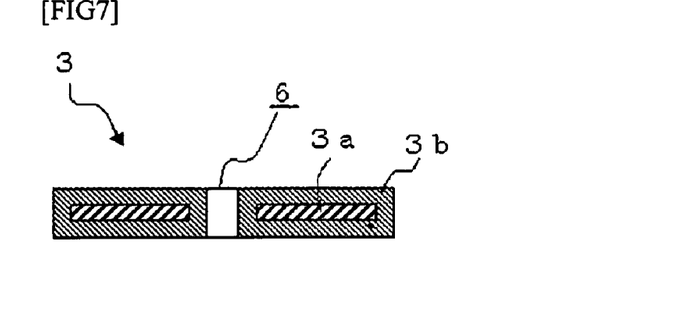
FIG. 7 is a cross section schematic diagram showing an example of the configuration of the heating element of the vacuum evaporation apparatus according to the first embodiment of the present invention.

As an example according to the first embodiment, the vacuum evaporation apparatus 20 shown in FIG. 1 was used. Here, the containers 1 made from carbon were the thickness of 1.2 mm, inside diameter 40 mm ø, and 15 mm of inner height, and used a maximum loading weight of 18 ml. As shown in FIG. 7, the carbon material 3a the surface of which is covered with 100 micrometers-thick PG (thermal degradable carbon) 3b with CVD was used for the heating element 3, in order to prevent a reaction with an organic material, mixing of impurities, etc. As the heating element 3, outside diameter size of 39 mm ø and 1.2 mm in thickness, and the doughnut shape with one central hole 6 of 5 mm ø was used.

And as it was not contacted with the container 1, the heating element 3 was placed on the organic material 2 mentioned later with which the container was filled up. Since the outer diameter of the heating element 3 is smaller than the inside diameter of the container 1, and it is not fixed to container 1, the heating element 3 moves in container 1 following reduction of an amount of the organic material 2 accompanying progress of vacuum evaporation, and the undersurface of the heating element 3 always contacts the surface of the organic material 2.

Since heating was performed by EB, and $Alq_3$ (an aluminum quinolinol complex, powder) was used as the organic material, the acceleration voltage of EB was adjusted so that the temperature of the heating element might be about 300 degrees C. The vacuum evaporation rate was measured using a crystal oscillating type rate monitor.

(Result)

A target vacuum evaporation rate of $10 \times 10^{-10}$ m/s was reached in about 10 seconds by the acceleration voltage of EB being 10 kV and an emission current being 4 mA. Then, although the vacuum evaporation was continued for 10 hours or more, the vacuum evaporation rate was stable. Since it is easy to heat and cool a heating element quickly in EB heating, it is considered that it will quickly reach a target vacuum evaporation rate.

Furthermore, after completing the vacuum evaporation, when the organic material in the container and the contact area of an organic material and a heating element were observed, although the organic material received the thermal effect from the contact portion to the depth of about 1 to 2 mm, the initial powder state was maintained from the depths. Accordingly, since only the neighborhood of the surface of an organic material was heated by the heating element and the high-temperature degradation of the organic material by heating the whole container like conventional methods was prevented, it became clear that the vacuum evaporation rate could be stabilized also in vacuum evaporation over a prolonged period of time.

In addition, it verified that there had been no damage to the heating element by EB.

Example 2

Example According to the Fourth Embodiment

As an example according to the fourth embodiment, the vacuum evaporation apparatus 20E shown in FIG. 6 was used. This evaporation apparatus constitutes an evaporation source as a mass production evaporation apparatus.

EB method was adopted as the heating source 4E, the filament for generating EB was built in the heating source 4E, and thermoelectrons were deflected by 270 degrees in the magnetic field circuit which is not illustrated in order to suppress contamination of a filament, and then the heating element of one cell was irradiated.

As the heating elements 3E1 to 3E4, outside diameter size of 39 mm ø and 1.2 mm thick disk made from carbon was divided into quarters, and they were made fan shape with one central hole 6 of 5 mm ø respectively. And then, as each heating element did not contact to the containers 1E1 to 1E4 respectively, each heating element was placed on the same organic material 2 as the above with which each container was filled up. Since the outer diameter of each heating element is smaller than the inside diameter of each container, and is not fixed to the container, each heating element moves in each container following reduction of an amount of the organic material 2 accompanying progress of vacuum evaporation, and the undersurface of each heating element always contacts the surface of the organic material 2.

When vacuum evaporation advanced and the organic material of cell 1E4 of FIG. 6 was exhausted, the container 1E was rotated one quarter revolution in the direction of arrow A according to the rotating feature 17. On the other hand, the vacuum evaporation was continued using the adjacent cell 1E3. And at the same time the organic material was supplied to the cell 1E1 in which the organic material was exhausted. By repeating this operation, the evaporation process could be performed continuously for 140 hours.

Example 3

Example According to the Second Embodiment

As an example according to the second embodiment, the vacuum evaporation apparatus 20C shown in FIG. 4 was used.

The container 1C was made from alumina which is the material not induction heated, and was used as about 100 cc mass container suitable for mass production. In order to evaporate continuously for one week, a plurality of above-mentioned containers 1C were installed in the vacuum chamber, and continuous evaporation was performed with exchanging the containers suitably. The organic material 2 was the same as that of Example 1. The heating element 3C was made from carbon and had one hole.

As the heating source 4C, the induction coil for high frequency induction heating made from a copper pipe was used.

By using the apparatus of above, the power supply was turned on from the high-frequency power source 12, and induction heating was started. At the time of the heating element 3C was heated, the temperature of the organic material 2 which contacts this also began to rise, and when evaporating temperature was reached, evaporation particles emitted a jet from the hole of the heating element 3. The jetting volume of evaporation particles was monitored with the crystal oscillating type thickness control device allocated near the substrate 7. In order to keep constant the setup vacuum evaporation rate, the current supplied to an induction coil was controlled according to the film thickness obtained by using the crystal oscillating type thickness control device, and the amount of the evaporation particles which reach on the substrate 7 was always controlled uniformly.

Along with progress of vacuum evaporation, the organic material reduced its weight, the heating element moved in the container following it, and it was verified that the undersurface of the heating element always contacted on the surface of the organic material. Accordingly, the evaporation particles could be uniformly adhered on the substrate for long duration with poise.

Example 4

Example According to the Third Embodiment

As an example according to the third embodiment, the vacuum evaporation apparatus 20D shown in FIG. 5 was used.

A quartz glass that transmits infrared wavelengths was used for the container 1D.

Heat was conducted by using the above-mentioned apparatus. The amount of the evaporation particles which reach substrate 7 was always uniformly controlled by monitoring the amount of evaporation particles by using the crystal oscillating type thickness control device, and controlling the current supplied to the infrared heating source.

Comparative Example 1

In FIG. 1, the organic material 2 was heated the same as Example 1 except for not using the heating element 3 and having irradiated the side of the container 1 with EB directly.
(Result)

As a result, since the temperature of the organic material 2 of the contact portion with a side wall surface rose faster rather than the temperature of the organic material 2 of the center section of container 1, and the evaporation preceded and advanced from near the wall surface, space was formed in the above-mentioned contact portion. Therefore, the constant vacuum evaporation rate was ensured so that it might become a higher temperature by adjusting heating in series.

After termination of vacuum evaporation, when the organic material in the container was viewed, its having received the thermal effect is clearly verified. Here, when the used organic material was changed into CuPc (copper phthalocyanine) and TPD (triphenylamine dimer) from $Alq_3$, blackening of the organic material was observed besides melting by thermal deterioration. It is considered that this thermal deterioration was generated since the heating state of the organic material became uneven according to the position in the container and became partly of higher temperature than needed.

Furthermore, when adjusting EB, having given damage to the container was confirmed.

Comparative Example 2

Not using the heating element, using stainless steel as the container, the outer side surface of this container was heated with the usual heater. Since CuPc (copper phthalocyanine) was used as the organic material, heating temperature was adjusted at about 400 degrees C. Furthermore, the vacuum evaporation rate was measured by using crystal oscillating type rate monitor.

In this case, indirect heating of the organic material was performed through the container by the heater. About one hour was needed until vacuum evaporation began from the heating start, since the heat transfer from the heater under vacuum environment was based on radiant heat transfer.

Moreover, the temperature response property for heater power was bad, and it was also difficult for stabilization of the vacuum evaporation rate.

What is claimed is:

1. A method of organic material vacuum evaporation for forming an evaporated material on a substrate, wherein the substrate is opposed from a vacuum evaporation source, wherein the vacuum evaporation source is provided with a container containing an organic material and having one open side, the vacuum evaporation source further having a heating element which, without being fixed to the container, is in contact with a surface of the organic material held in the container, the method comprising the steps of:
   evaporating the organic material by heating only the heating element; and
   releasing the evaporated material through at least one hole or at least one slit formed in the heating element.

2. The method according to claim 1, wherein as the method for heating the heating element, at least one or more kinds of electron beam heating, high frequency induction heating, laser beam heating, and infrared heating are used.

3. The method according to claim 1, wherein a plurality of containers are provided, or wherein the inside of the container is divided into a plurality of partitions, and wherein the steps are performed in each of the plurality of containers or partitions one after another continuously, changing the container or partition in which the steps are performed to the next container or partition when the organic material in the container or partition in which the steps are being performed decreases.

4. The method according to claim 2, wherein a plurality of containers are provided, or wherein the inside of the container is divided into a plurality of partitions, and wherein the steps are performed in each of the plurality of containers or partitions one after another continuously, changing the container or partition in which the steps are performed to the next container or partition when the organic material in the container or partition in which the steps are being performed decreases.

5. The method according to claim 3, wherein the organic material is filled up in the container or the partition in which the organic material decreased, through a hole or a slit in the heating element.

6. The method according to claim 4, wherein the organic material is filled up in the container or the partition in which the organic material decreased, through a hole or a slit in the heating element.

7. The method according to claim 1, wherein the container is held below or at the evaporating temperature of the organic material.

8. The method according to claim 2, wherein the container is held below or at the evaporating temperature of the organic material.

9. The method according to claim 3, wherein the container is held below or at the evaporating temperature of the organic material.

10. The method according to claim 4, wherein the container is held below or at the evaporating temperature of the organic material.

11. The method according to claim 5, wherein the container is held below or at the evaporating temperature of the organic material.

12. The method according to claim 6, wherein the container is held below or at the evaporating temperature of the organic material.

13. An apparatus for organic material vacuum deposition, wherein the apparatus emits an evaporated material for forming a film on an opposed substrate, the apparatus comprising:
a container for containing an organic material to be evaporated, the container having an opening on one side;
a heating element, wherein the heating element is smaller than the opening and is in contact with the surface of the organic material in the container without being fixed to the container, the heating element having at least one hole for releasing evaporated material, or having at least one slit for releasing evaporated material; and
a heating source for heating only the heating element.

14. The apparatus according to claim 13, wherein the heating source is at least one or more kinds of an electron beam heating source, a high frequency induction heating source, a laser beam heating source, and an infrared heating source.

15. The apparatus according to claim 13, wherein a plurality of containers are provided, or the inside of the container is divided into a plurality of partitions, and a heating element is provided for the plurality of containers or partitions, wherein the apparatus further comprises a moving means for moving the plurality of containers or partitions to a predetermined heating position in order to heat the heating element which one of the plurality of containers or partitions possesses by using the heating source, while the moving means disengages from the heating position the container or partition from which evaporated material has been emitted and the organic material therein has decreased.

16. The apparatus according to claim 14, wherein a plurality of containers are provided, or the inside of the container is divided into a plurality of partitions, and a heating element is provided for the plurality of containers or partitions, wherein the apparatus further comprises a moving means for moving the plurality of containers or partitions to a predetermined heating position in order to heat the heating element which one of the plurality of containers or partitions possesses by using the heating source, while the moving means disengages from the heating position the container or partition from which evaporated material has been emitted and the organic material therein has decreased.

17. The apparatus according to claim 15, further comprising an organic material feed feature for supplying organic material to the container or partition from which organic material has decreased.

18. The apparatus according to claim 16, further comprising an organic material feed feature for supplying organic material to the container or partition from which organic material has decreased.

* * * * *